United States Patent [19]

Seo

[11] Patent Number: 5,742,365
[45] Date of Patent: Apr. 21, 1998

[54] LIQUID CRYSTAL DISPLAY DEVICE AND METHOD FOR MANUFACTURING THE SAME IN WHICH A LIGHT SHIELDING LAYER IS OVER THE GATE ELECTRODE OR A GATE ELECTRODE IS IN A TRENCH

[75] Inventor: Hyun Sik Seo, Seoul, Rep. of Korea

[73] Assignee: LG Electronics, Inc., Seoul, Rep. of Korea

[21] Appl. No.: 783,060

[22] Filed: Jan. 14, 1997

[30] Foreign Application Priority Data

Jan. 15, 1996 [KR] Rep. of Korea ............ 1996/672

[51] Int. Cl.$^6$ .................. G02F 1/136; G02F 1/1333; H01L 29/04; H01L 27/108
[52] U.S. Cl. .................. 349/43; 349/46; 349/110; 257/57; 257/301
[58] Field of Search .................. 349/42, 43, 46, 349/110; 257/59, 72, 301, 302, 303

[56] References Cited

U.S. PATENT DOCUMENTS

| | | | |
|---|---|---|---|
| 5,187,602 | 2/1993 | Ikeda et al. | 349/42 |
| 5,267,066 | 11/1993 | Nakai et al. | 349/110 |
| 5,317,432 | 5/1994 | Ino | 349/42 |

Primary Examiner—William L. Sikes
Assistant Examiner—Walter Malinowski
Attorney, Agent, or Firm—Morgan, Lewis & Bockius LLP

[57] ABSTRACT

A liquid crystal display device includes a substrate, a gate electrode on the substrate, a light shielding layer over the gate electrode and the substrate, an insulating layer over the light shielding layer and the substrate, a semiconductor layer having a channel region on the insulating layer over the gate electrode, source and drain electrodes over first and second portions of the semiconductor layer, respectively, and an ohmic contact layer between the semiconductor layer and each of the source and drain electrodes.

19 Claims, 7 Drawing Sheets

5,742,365

1

LIQUID CRYSTAL DISPLAY DEVICE AND METHOD FOR MANUFACTURING THE SAME IN WHICH A LIGHT SHIELDING LAYER IS OVER THE GATE ELECTRODE OR A GATE ELECTRODE IS IN A TRENCH

BACKGROUND OF THE INVENTION

1. Field of the Invention

The present invention relates to a liquid crystal display device and a method for manufacturing the same. More particularly, the present invention relates to a liquid crystal display device and a method for manufacturing the same, wherein a black matrix layer for preventing the transmission of light between pixels and the like is formed using a black resin from which a gate insulating film is also formed. In other words, the black resin is form the light-shielding black matrix layer as well as the gate insulating film.

2. Discussion of the Related Art

In general, a liquid crystal display device is comprised of a lower substrate on which each of a thin film transistor and a pixel electrode are arranged, an upper substrate on which each of a color filter for showing color, a common electrode, and a black matrix layer are formed, and liquid crystal material filling the space between the two substrates. Further, below the lower substrate, a black light is installed.

FIG. 1 shows a layout of the thin film transistor, the pixel electrode, and the black matrix layer of a general liquid crystal display device constructed in this manner. As shown in FIG. 1, a plurality of gate lines separated by a predetermined distance are arranged to extend in one direction. A plurality of data lines separated by a predetermined distance are arranged to extend in a direction perpendicular to the direction in which the gate lines extend. A thin film transistor (TFT) is formed at a point where the gate lines and the data lines cross each other. In pixel regions between the data lines and the gate lines, a transparent electrode (pixel electrode), such as an indium tin oxide (ITO), is formed so as to receive a data signal through the thin film transistor.

Further, in the thin film transistor—liquid crystal display (TFT-LCD) formed as described above, a black matrix layer is formed so as to shield the thin film transistor as well as the spaces between the pixel electrodes and the data lines and the gate lines.

A method of manufacturing a conventional liquid crystal display device having such a construction will be described below with reference to the attached drawings.

FIG. 2 is a cross-sectional view of the structure of a liquid crystal display device according to a first conventional embodiment.

In the structure of a liquid crystal display device according to the first conventional embodiment, multiple gate electrodes 2 are formed at a predetermined distance from one another on a lower glass substrate 1. A gate insulating film 3 is formed on an overall surface of the substrate including multiple gate electrodes 2. A semiconductor layer 4 is formed in an active region on each gate electrode 2.

A source electrode 5 and a drain electrode 6 are formed on the sides of semiconductor layer 4. Pixel electrode 7 is formed in a pixel region so as to be connected to drain electrode 6.

Also shown in FIG. 2 are a thin film transistor 12, a high concentration n-type semiconductor layer 11, and a protecting film 10.

On an upper glass substrate 13, as described above, black matrix layers 14 are formed so as to provide shielding

2 between the gate line including thin film transistor 12 formed on lower glass substrate 1 and the data line and the pixel electrode. On upper glass substrate 13 between black matrix layers 14, R, G, B color filter layers 15 are formed for realizing color.

Lower glass substrate 1 and upper glass substrate 13 which are formed as described above are attached to each other, with a liquid crystal injected therebetween.

However, in such a liquid crystal display device of the first conventional embodiment, there is the following problem. When attaching the two substrates, the substrates are attached so that light should be not be transmitted between the thin film transistor excluding the pixel electrode and the respective signal lines and the pixel electrode by the black matrix layer. Therefore, the attachment margin is small, so that the manufacturing process is difficult. In addition, if the black matrix layer is extended by a predetermined distance (d) for increasing the attachment margin, as shown in FIG. 2, the aperture ratio is relatively decreased.

Accordingly, in order to avoid this problem, a second conventional embodiment wherein a black matrix layer is formed on a lower glass substrate has been developed.

FIG. 3 is a cross-sectional view of the structure of a liquid crystal display device according to the second conventional embodiment.

In the liquid crystal display device of the second conventional embodiment, first black matrix layers 14 are formed a predetermined distance from one another on a lower glass substrate 1. An insulating film 19 is formed on the entire surface of the glass substrate 1, including first black matrix layers 14. A gate electrode 2 is formed on insulating film 19 on the upper side of first black matrix layers 14.

A gate insulating film 3 is formed on insulating film 19 and gate electrode 2 above first matrix layer 14. A pixel electrode 7 is formed on insulating film 19 on both sides of gate insulating film 3. A semiconductor layer 4 is formed on gate insulating film 3 above gate electrode 2. A source electrode 5 and a drain electrode 6 are formed on both sides of semiconductor layer 4. At this time, drain electrode 6 is electrically connected to pixel electrode 7.

Also shown in FIG. 3 are a protecting film 10, a high concentration n-type semiconductor layer 11, and a thin film transistor 12.

Second black matrix layers 18 are formed on an upper glass substrate 13 so that light is not transmitted in a channel region of the thin film transistor formed on the lower glass substrate. R, G, B color filter layers 15 are formed on upper glass substrate 13 between second black matrix layers 18. A common electrode 16 is formed over color filter layer 15 and second black matrix layer 18.

Preferably, the first black matrix layer is formed of a metal or a black resin. However, in the case where metal is used, a parasitic capacitance is caused with the gate electrode. Thus, it is more efficient to use the black resin.

In the second conventional embodiment, the black matrix layer is formed on the lower glass substrate on which the thin film transistor and the pixel electrode are formed, thereby improving the attachment margin which is a problem in the first conventional embodiment. However, the step-difference between the part where the black matrix layer is formed and the part where no black matrix layer is formed is severe. Further, since the thin film transistor should be formed on the black matrix layer, the step-difference becomes more and more severe, so that subsequent processes become difficult.

SUMMARY OF THE INVENTION

Accordingly, the present invention is directed to a liquid crystal display device that substantially obviates one or more of the problems due to limitations and disadvantages of the related art.

It is an object of the present invention to provide a liquid crystal display device and a method for manufacturing the same, wherein a black resin is used as a gate insulating film, thereby simplifying the manufacturing process and providing other advantages.

To achieve these and other advantages and in accordance with the purpose of the present invention, as embodied and broadly described, a liquid crystal display device is provided including a substrate; a gate electrode on the substrate; a light shielding layer over the gate electrode and the substrate; an insulating layer over the light shielding layer and the substrate; a semiconductor layer having a channel region on the insulating layer over the gate electrode; source and drain electrodes over first and second portions of the semiconductor layer, respectively; and an ohmic contact layer between the semiconductor layer and each of the source and drain electrodes.

In another aspect of the present invention, a liquid crystal display device includes a substrate having a trench; a gate electrode in the trench of the substrate; a light shielding layer over the sate electrode and the substrate; an insulating layer over the light shielding layer and the substrate; a semiconductor layer having a channel region on the insulating layer over the gate electrode; source and drain electrodes over first and second portions of the semiconductor layer, respectively; and an ohmic contact layer between the semiconductor layer and each of the source and drain electrodes.

In another aspect of the present invention, a liquid crystal display device includes a gate electrode on a first substrate; a black resin layer on at least a first portion of the first substrate and the gate electrode; a gate insulating firm over the black resin layer and on at least a second portion of the first substrate; a first semiconductor layer on the gate insulating film above the gate electrode; source and drain electrodes on respective sides of the first semiconductor layer; a second semiconductor layer between the first semiconductor layer and each of the source and drain electrodes; and a pixel electrode on a pixel region of the liquid crystal display and connected to one of the source and drain electrodes.

In another aspect of the present invention, a method of manufacturing a liquid crystal display device includes the steps of forming a gate electrode on a substrate; forming a light shielding layer on at least a first portion of the substrate and on the gate electrode; forming a gate insulating firm over at least a second portion of the substrate and on the black resin layer; sequentially forming a first semiconductor layer and a second semiconductor layer on the gate insulating film above the gate electrode; forming source and drain electrodes on respective sides of the first and second semiconductor layers; depositing a protecting film over at least the source and drain electrodes; and forming a pixel electrode on a pixel region of the liquid crystal display device and connected to one of the source and drain electrodes.

In a further aspect of the present invention, a liquid crystal display device includes a substrate having a trench; a gate electrode in the trench of the substrate; an opaque layer on at least a first portion of the substrate and the gate electrode; a gate insulating film on at least a second portion of the substrate and on the opaque layer; at least one semiconductor layer above the gate electrode; source and drain electrodes on respective sides of the semiconductor layer and a pixel electrode in electrical contact with one of the source and drain electrodes.

Additional features and advantages of the invention will be set forth in the description which follows, and in part will be apparent from the description, or may be learned by practice of the invention. The objectives and other advantages of the invention will be realized and attained by the structure and method particularly pointed out in the written description and claims hereof as well as the appended drawings.

It is to be understood that both the foregoing general description and the following detailed description are exemplary and explanatory only are not restrictive of the invention, as claimed.

BRIEF DESCRIPTION OF THE DRAWINGS

The accompanying drawings, which are incorporated in and constitute a part of this specification, illustrate several embodiments of the invention and together with the description, serve to explain the principles of the invention.

DETAILED DESCRIPTION OF THE PREFERRED EMBODIMENTS

The liquid crystal display device of the present invention includes a gate electrode formed on a first substrate and a black resin layer formed on at least a first portion of the substrate and the gate electrode for insulating the gate electrode and for shielding light. A gate insulating film is formed on at least a second portion of the first substrate and on the black resin layer and a semiconductor layer is formed on the gate insulating film above the gate electrode. Source and drain electrodes are formed on respective sides of the semiconductor layer and a high concentration n-type semiconductor layer is formed on the semiconductor layer between the source and drain electrodes. A pixel electrode is formed on a pixel region in connection with the drain electrode.

A method for manufacturing a liquid crystal display device of the present invention includes the steps of forming a gate electrode on a substrate and forming a black resin layer on at least a first portion of the substrate and on the gate electrode at a position partially outside a pixel region. The method includes forming a gate insulating film on at least a second portion of the substrate and on the black resin layer, and sequentially forming a semiconductor layer and a high concentration n-type semiconductor layer on the gate insulating film above the gate electrode. The method includes forming source and drain electrodes on respective sides of the semiconductor layer and the high concentration n-type semiconductor layer and depositing a protecting film over at least the source and drain electrodes. Then, a contact hole is formed adjacent the drain electrode and a pixel electrode is formed at least partially on the pixel region in connection with the drain electrode.

Reference will now be made in detail to the preferred embodiments of the present invention, examples of which are illustrated in the accompanying drawings.

Figure 1:
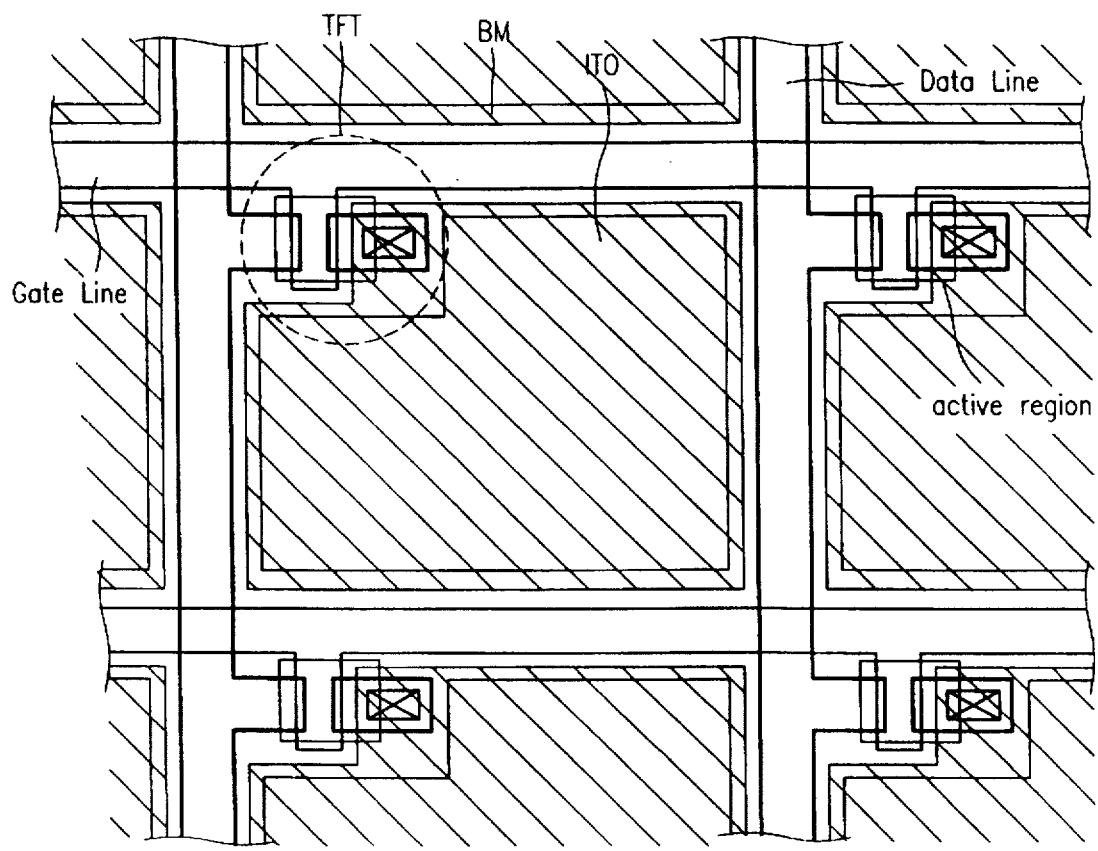
FIG. 1 is a layout diagram of a general liquid crystal display device.
Figure 2:
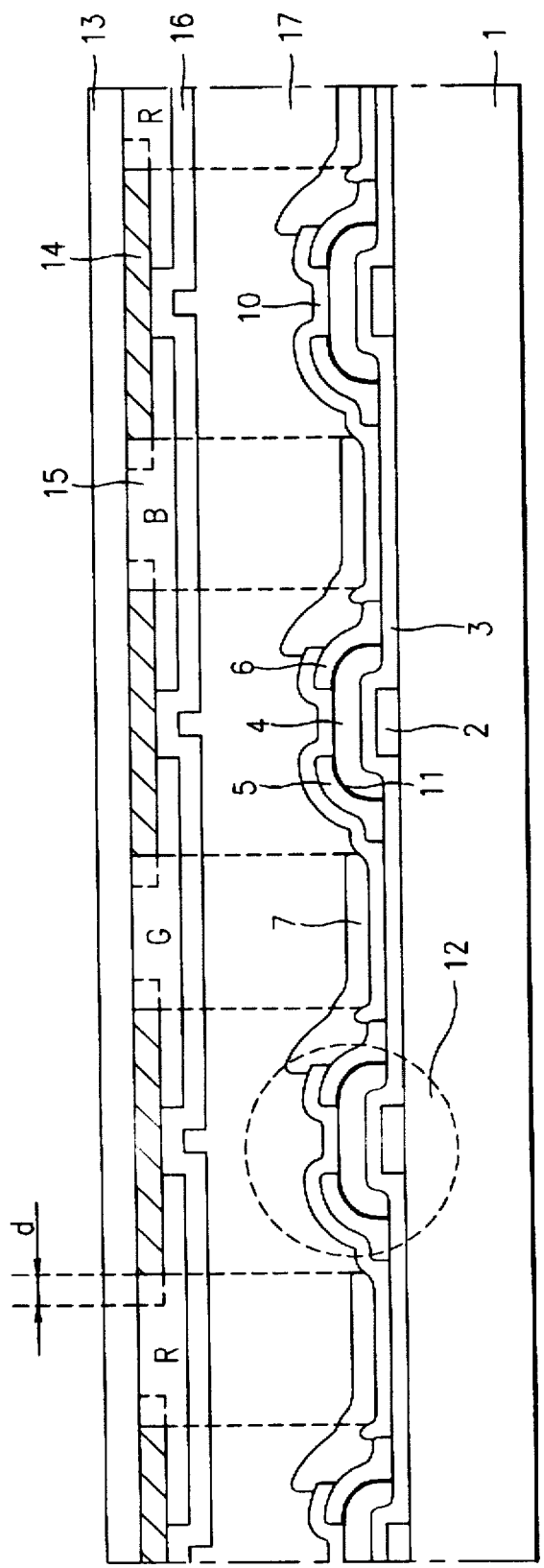
FIG. 2 is a cross-sectional view of a liquid crystal display device according to a first conventional embodiment.
Figure 3:
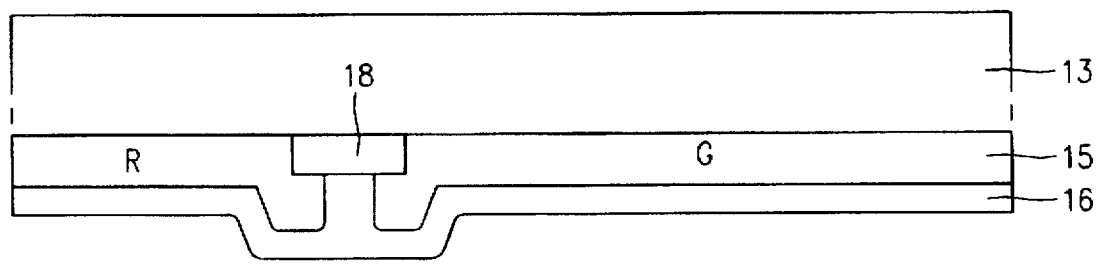
FIG. 3 is a cross-sectional view of a liquid crystal display device according to a second conventional embodiment.
Figure 3:
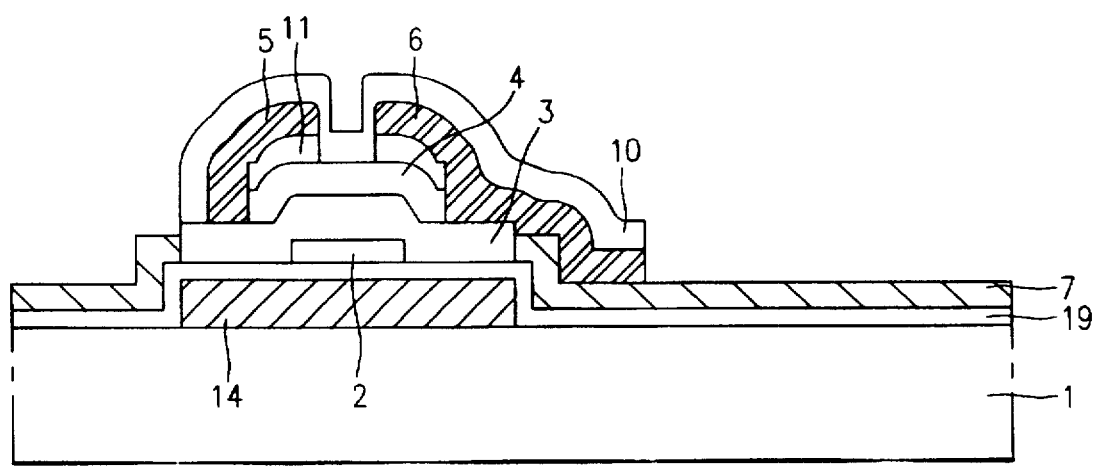
Figure 4:
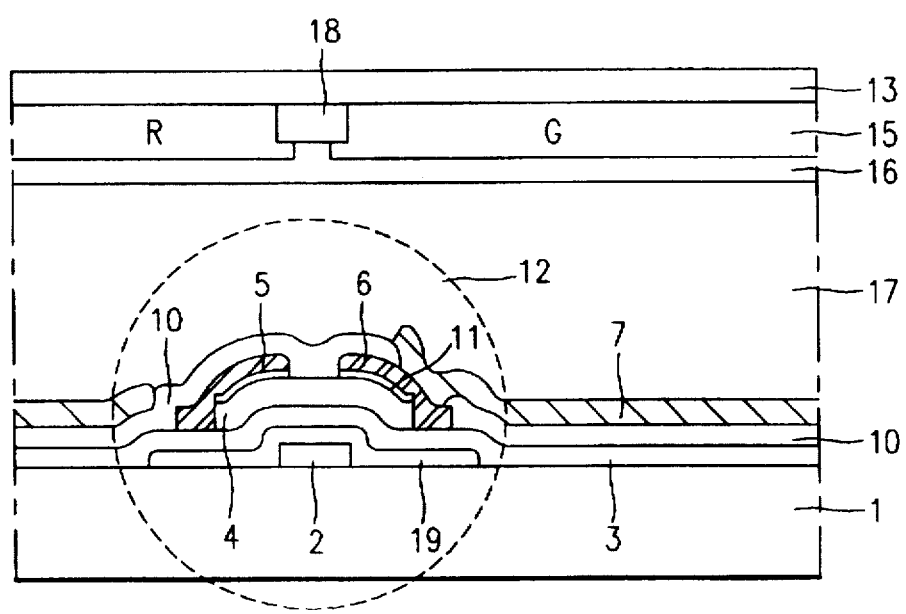
FIG. 4 is a cross-sectional view of a liquid crystal display device according to the present invention.

As shown in FIG. 4, in the liquid crystal display device according to the present invention, a gate electrode 2 is formed on a lower glass substrate 1. In order to shield a thin film transistor as well as the space between each signal line (not shown) and a pixel electrode, and to insulate gate electrode 2, a black resin 19 is formed on lower glass substrate 1 centered around gate electrode 2. A gate insulating film 3 is formed on the entire surface of the substrate, including black resin 19. A semiconductor layer 4 is formed on gate insulating film 3 on the upper side of gate electrode 2. A source electrode 5 and a drain electrode 6 are formed on both sides of semiconductor layer 4. A pixel electrode 7 is formed in a pixel region so as to be connected to drain electrode 6.

Also shown in FIG. 4 are a thin film transistor 12, a high concentration n-type semiconductor layer 11, and a protecting film 10.

Black matrix layers 18 are formed on an upper glass substrate 13 so as to shield a channel region of the thin film transistor formed on lower glass substrate 1. R, G, B color filter layers 15 are formed on upper glass substrate 13 between black matrix layers 14, for realizing color. A common electrode 16 is formed over black matrix layer 18 and color filter layer 15. A liquid crystal layer is formed between lower glass substrate 1 and upper glass substrate 13.

Here, black resin 19 is formed to a thickness of 0.8~1.2 μm (more preferably, to a thickness of about 1 μm). Gate insulating film 3 is formed to be thinner (about 500~1500 Å) than in the conventional method, because the insulating property thereof cannot be considered.

Further, in relation to the step-difference of the black resin, the glass substrate on which the black resin is formed is etched to a predetermined depth, so that a trench structure can be formed.

A method of manufacturing the liquid crystal display having such a structure according to the present invention will now be described below with reference to FIGS. 5A to 5F.

Figure 5A:
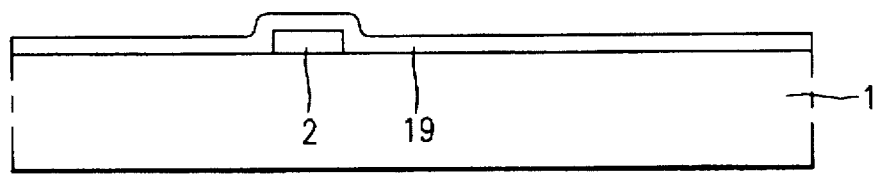
FIGS. 5A to 5F are cross-sectional views illustrating a method for manufacturing a liquid crystal display device according to the present invention.

As shown in FIG. 5A, a gate electrode 2 is formed on a lower glass substrate 1. A black resin 19 is then deposited to a thickness of 0.8~1.2 μm (more preferably, of about 1 μm) on the gate electrode 2 and the substrate 1.

Figure 5B:
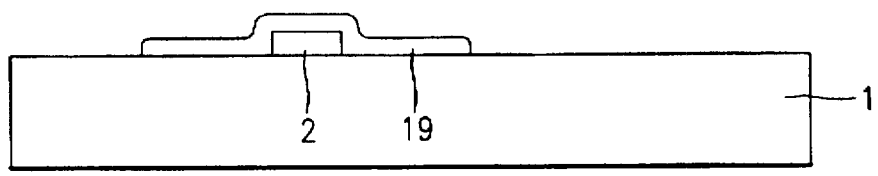

As shown in FIG. 5B, in order to shield a thin film transistor region as well as the space between each signal line (not shown) and a pixel electrode, and to insulate gate electrode 2, black resin 19 is patterned through a photolithography and etching process on lower glass substrate 1 so as to be centered around gate electrode 2.

Figure 5C:
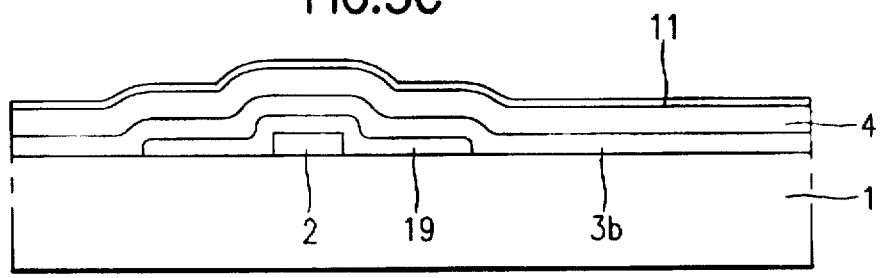

As shown in FIG. 5C, a gate insulating film (e.g., a silicon nitride film) 3b is formed to a thickness of about 500~1500 Å on the entire surface of glass substrate 1 including black resin 19. A semiconductor layer (e.g., an amorphous silicon layer) 4 and a high concentration n-type semiconductor layer (e.g., a high concentration n-type amorphous silicon layer) 11 are sequentially deposited over the aforementioned structure.

Figure 5D:
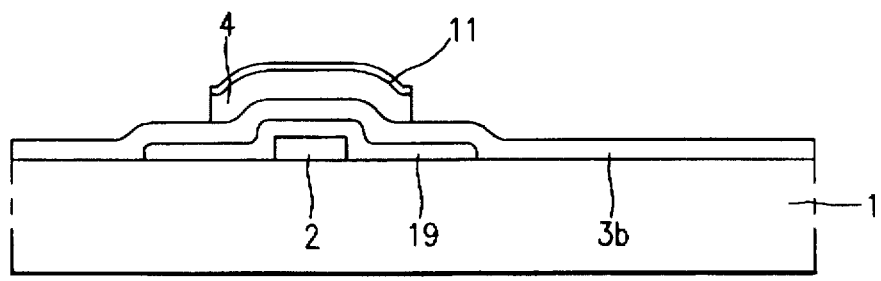

As shown in FIG. 5D, semiconductor layer 4 and high concentration n-type semiconductor layer 11 are patterned through a photolithography and etching process, so as to be left only in an active region on the upper side of gate electrode 2.

Figure 5E:
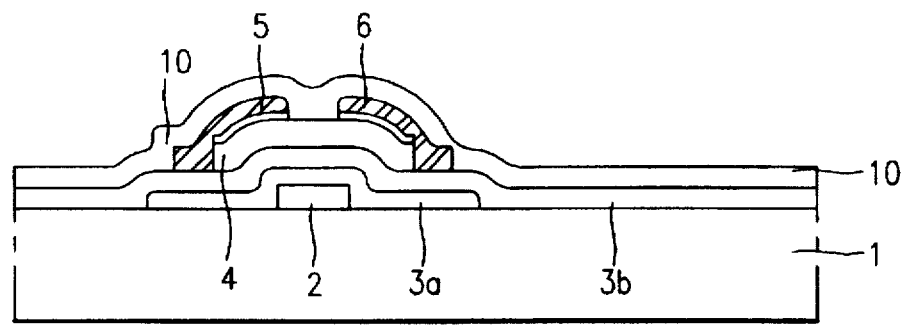

As shown in FIG. 5E, a metal (e.g., Cr) is deposited on the overall surface of the aforementioned structure and patterned through a photolithography and etching process, so as to be left on both sides of the semiconductor layer, thereby forming a source electrode 5 and a drain electrode 6. Then, a protecting film 10 is deposited on the entire surface of the resulting structure.

Figure 5F:
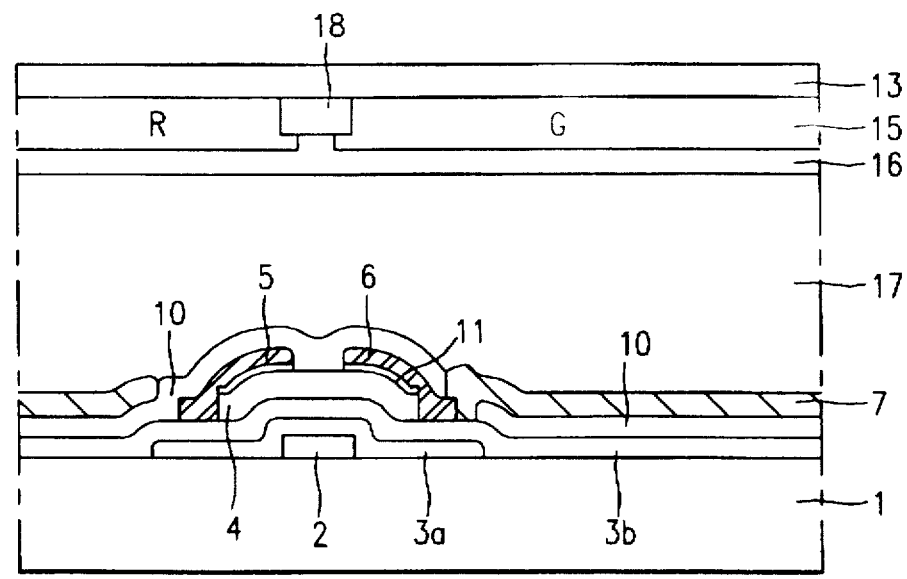

As shown in FIG. 5F, protecting film 10 on drain electrode 6 is selectively removed, thereby forming a contact hole. A pixel electrode (e.g., an ITO) 7 is formed on a pixel region so as to be connected to drain electrode 6.

Further, though not shown, black matrix layers 18 are formed on an upper glass substrate 13, to a predetermined size so as to shield the channel region of the thin film transistor formed on lower glass substrate 1. R, G, B color filter layers 15 are sequentially formed on upper glass substrate 13 between black matrix layers 18. A common electrode 16 is formed over color filter layer 15 and second black matrix layer 18.

Lower glass substrate 1 and upper glass substrate formed as described above are attached to each other, with a predetermined space therebetween. Then, a liquid crystal 17 is injected between the two substrates.

Figure 6:
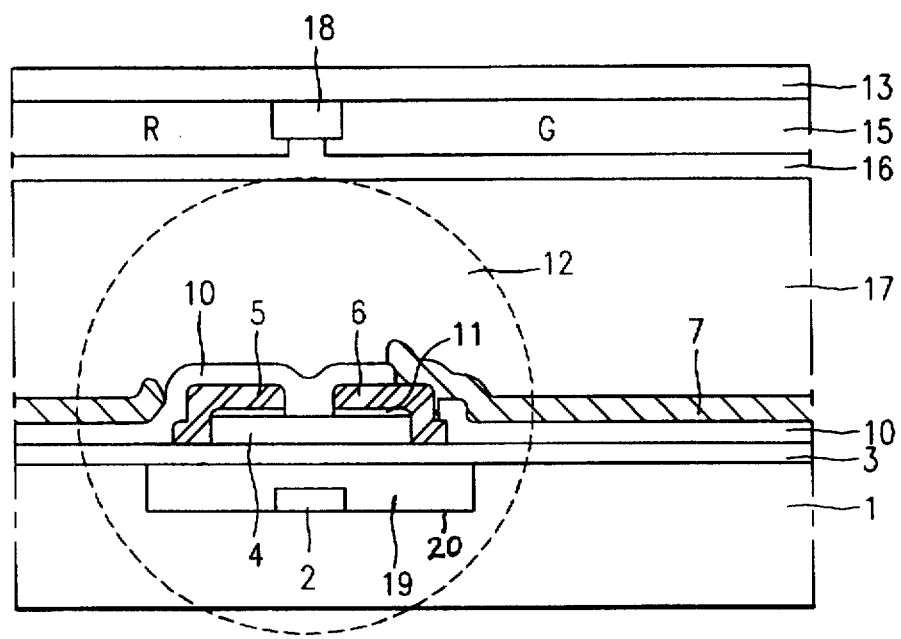
FIG. 6 is a cross-sectional view of another embodiment of a liquid crystal display device of the present invention.

Meanwhile, according to another embodiment of the present invention, before forming gate electrode 2, the corresponding portion of the glass substrate where the black resin is to be formed may be selectively etched to form a trench 20, as shown in FIG. 6. Then, the lower glass substrate may be formed according to the aforementioned process.

As described above, in the liquid crystal display device and the method for manufacturing the same according to the present invention, the following effects are achieved.

First of all, the black resin not only shields light, but also serves as the gate insulation film for insulating the gate. Thus, the thickness of the gate insulating film can be reduced.

Secondly, since the black resin is used as the gate insulating film, the attachment margin of the black matrix layer can be increased. As a result, the manufacturing process can be simplified.

It will be apparent to those skilled in the art that various modifications and variations can be made in the structure of liquid crystal display device and method for manufacturing the same of the present invention without departing from the spirit or scope of the invention. Thus, it is intended that the present invention cover the modifications and variations of this invention provided they come within the scope of the appended claims and their equivalents.

What is claimed is:

1. A liquid crystal display device comprising:

a substrate;

a gate electrode on the substrate;

a light shielding layer over the gate electrode and the substrate;

an insulating layer over the light shielding layer and the substrate;

a semiconductor layer having a channel region on the insulating layer over the gate electrode;

source and drain electrodes over first and second portions of the semiconductor layer, respectively; and an ohmic contact layer between the semiconductor layer and each of the source and drain electrodes.

2. The liquid crystal display device according to claim 1, further comprising:

a passivation layer over the source and drain electrodes, the passivation layer having a contact hole over one of the source and drain electrodes; and a pixel electrode contacting the one of the source and drain electrodes through the contact hole.

3. The liquid crystal display device according to claim 1, further comprising:

a pixel electrode over the gate insulating layer and contacting one of the source and drain electrodes; and a passivation layer over the pixel electrode.

4. The liquid crystal display device according to claim 1, further comprising:

a second substrate; and a second light shielding layer over the second substrate for shielding the channel region.

5. A liquid crystal display device comprising:

a substrate having a trench;

a gate electrode in the trench of the substrate;

a light shielding layer over the gate electrode and the substrate;

an insulating layer over the light shielding layer and the substrate;

a semiconductor layer having a channel region on the insulating layer over the gate electrode;

source and drain electrodes over first and second portions of the semiconductor layer, respectively; and an ohmic contact layer between the semiconductor layer and each of the source and drain electrodes.

6. The liquid crystal display device according to claim 5, further comprising:

a passivation layer over the source and drain electrodes, the passivation layer having a contact hole over one of the source and drain electrodes; and a pixel electrode contacting the one of the source and drain electrodes through the contact hole.

7. The liquid crystal display device according to claim 5, further comprising:

a pixel electrode over the gate insulating layer and contacting one of the source and drain electrodes; and a passivation layer over the pixel electrode.

8. The liquid crystal display device according to claim 5, further comprising:

a second substrate; and a second light shielding layer over the second substrate for shielding the channel region.

9. A liquid crystal display device comprising:

a gate electrode on a first substrate;

a black resin layer on at least a first portion of the first substrate and the gate electrode;

a gate insulating film over the black resin layer and on at least a second portion of the first substrate;

a first semiconductor layer on the gate insulating film above the gate electrode;

source and drain electrodes on respective sides of the first semiconductor layer;

a second semiconductor layer between the first semiconductor layer and each of the source and drain electrodes; and a pixel electrode on a pixel region of the liquid crystal display and connected to one of the source and drain electrodes.

10. The liquid crystal display device according to claim 9, further comprising a second substrate having a second black resin layer, the second black resin layer shielding a channel region between the source electrode and the drain electrode from light.

11. The liquid crystal display device according to claim 9, wherein the first portion of the first substrate has a trench, the black resin layer being located in the trench.

12. A method of manufacturing a liquid crystal display device, the method comprising the steps of:

forming a gate electrode on a substrate;

forming a light shielding layer comprising a black resin layer, on at least a first portion comprising a black resin layer, of the substrate and on the gate electrode;

forming a gate insulating film over at least a second portion of the substrate and on the black resin layer;

sequentially forming a first semiconductor layer and a second semiconductor layer on the gate insulating film above the gate electrode;

forming source and drain electrodes on respective sides of the first and second semiconductor layers;

depositing a protecting film over at least the source and drain electrodes; and forming a pixel electrode on a pixel region of the liquid crystal display device and connected to one of the source and drain electrodes.

13. The method of manufacturing a liquid crystal display device according to claim 12, further comprising the step of selectively etching the first portion of the substrate to form a trench where the black resin is located before forming the gate electrode.

14. The method of manufacturing a liquid crystal display device according to claim 12, wherein the black resin layer is formed to a thickness of approximately 0.8~1.2 µm.

15. The method of manufacturing a liquid crystal display device according to claim 12, wherein the gate insulating film is formed to a thickness of approximately 500~1500 Å.

16. The method of manufacturing a liquid crystal display device according to claim 12, further comprising the step of forming a second substrate having a second light shielding layer, the second light shielding layer being positioned to shield a channel region between the source and drain electrodes.

17. A liquid crystal display device comprising:

a substrate having a trench;

a gate electrode in the trench of the substrate;

an opaque layer on at least a first portion of the substrate and the gate electrode;

a gate insulating film on at least a second portion of the substrate and on the opaque layer;

at least one semiconductor layer above the gate electrode;

source and drain electrodes on respective sides of the semiconductor layer; and a pixel electrode in electrical contact with one of the source and drain electrodes.

18. The liquid crystal display device according to claim 17, wherein the opaque layer comprises an insulating layer insulating the gate electrode and shielding light.

19. The liquid crystal display device according to claim 18, wherein the insulating layer includes a black resin film.

* * * * *

UNITED STATES PATENT AND TRADEMARK OFFICE
CERTIFICATE OF CORRECTION

PATENT NO. : 5,742,365
DATED : April 21, 1998
INVENTOR(S) : Seo

It is certified that error appears in the above-identified patent and that said Letters Patent is hereby corrected as shown below:

Column 8, line 15, delete "layer" to delete --compromising a black resin layer--.

Signed and Sealed this

Twenty-ninth Day of June, 1999

Attest:

Q. TODD DICKINSON

Attesting Officer    Acting Commissioner of Patents and Trademarks